United States Patent
Kawano

(10) Patent No.: US 10,809,228 B2
(45) Date of Patent: Oct. 20, 2020

(54) METHOD AND APPARATUS FOR QUANTITATIVELY EVALUATING AMOUNT OF DISPERSION MEDIUM ADSORBED TO DISPERSOID PARTICLES

(71) Applicant: KAWANO Lab. Inc., Osaka (JP)

(72) Inventor: Makoto Kawano, Ikeda (JP)

(73) Assignee: KAWANO Lab. Inc., Osaka (JP)

( * ) Notice: Subject to any disclaimer, the term of this patent is extended or adjusted under 35 U.S.C. 154(b) by 209 days.

(21) Appl. No.: 15/739,822

(22) PCT Filed: Jun. 24, 2016

(86) PCT No.: PCT/JP2016/068849
§ 371 (c)(1),
(2) Date: Dec. 26, 2017

(87) PCT Pub. No.: WO2016/208723
PCT Pub. Date: Dec. 29, 2016

(65) Prior Publication Data
US 2018/0164249 A1    Jun. 14, 2018

(30) Foreign Application Priority Data
Jun. 25, 2015  (JP) ................. 2015-127825

(51) Int. Cl.
*G01N 27/76*  (2006.01)
*G01R 33/16*  (2006.01)
(Continued)

(52) U.S. Cl.
CPC ........... *G01N 27/76* (2013.01); *G01N 15/088* (2013.01); *G01N 15/1031* (2013.01); *G01R 33/1215* (2013.01); *G01R 33/16* (2013.01)

(58) Field of Classification Search
CPC .. G01N 27/76; G01N 15/088; G01N 15/1031; G01R 33/16; G01R 33/56536; G01R 33/1215; B03C 2201/24
(Continued)

(56) References Cited

U.S. PATENT DOCUMENTS 8,114,602 B2 * 2/2012 Groves ............. G01N 33/5432
435/5
9,366,614 B2   6/2016 Kawano et al.
(Continued)

FOREIGN PATENT DOCUMENTS

EP   2741079 A1   6/2014
JP   2002-022704 A   1/2002
(Continued)

OTHER PUBLICATIONS

International Search Report issued in PCT/JP2016/068849, dated Sep. 20, 2016.
(Continued)

*Primary Examiner* — Tung X Nguyen
*Assistant Examiner* — Robert P Alejnikov, Jr.
(74) *Attorney, Agent, or Firm* — Studebaker & Brackett PC

(57) ABSTRACT

Volume susceptibilities ($\chi$s) of dispersoid particles (s) dispersed in a dispersion medium (m) are first obtained by magnetophoresis. Affinity of the dispersoid particles (s) for the dispersion medium (m) is then analyzed using the volume susceptibilities ($\chi$s) of the respective dispersoid particles (s) and a volume susceptibility ($\chi$m) of the dispersion medium (m).

16 Claims, 10 Drawing Sheets

(51) Int. Cl.
*G01R 33/12* (2006.01)
*G01N 15/08* (2006.01)
*G01N 15/10* (2006.01)

(58) Field of Classification Search
USPC ........................................................ 324/201
See application file for complete search history.

(56) References Cited

U.S. PATENT DOCUMENTS

| | | | | |
|---|---|---|---|---|
| 2002/0182627 | A1* | 12/2002 | Wang | G01N 33/5005 435/6.11 |
| 2004/0101970 | A1* | 5/2004 | Viovy | C08F 251/00 436/174 |
| 2009/0085557 | A1* | 4/2009 | Krozer | G01R 33/12 324/201 |
| 2013/0004982 | A1* | 1/2013 | Bar | G01N 33/587 435/29 |
| 2014/0021105 | A1* | 1/2014 | Lee | G01N 27/44756 209/214 |
| 2014/0109652 | A1* | 4/2014 | AlSofi | G01N 33/24 73/38 |
| 2014/0174157 | A1* | 6/2014 | Kawano | G01N 15/088 73/38 |
| 2015/0145515 | A1* | 5/2015 | Liu | G01R 33/243 324/309 |
| 2016/0209366 | A1* | 7/2016 | Kawano | G01N 15/088 |
| 2018/0196004 | A1* | 7/2018 | Kawano | G01N 27/76 |

FOREIGN PATENT DOCUMENTS

| | | |
|---|---|---|
| JP | 2002071645 A | 3/2002 |
| WO | 2013/021910 A1 | 2/2013 |
| WO | 2015/030184 A1 | 3/2015 |

OTHER PUBLICATIONS

Makoto Kawano et al.; "New Particle Analysis Method by Magnetic Susceptibility Measurement"; Convertech; Dec. 15, 2013; pp. 98-101; vol. 41, No. 12.

The extended European search report issued by the European Patent Office dated Jan. 30, 2019, which corresponds to European Patent Application No. 16814492.1 and is related to U.S. Appl. No. 15/739,822.

* cited by examiner

METHOD AND APPARATUS FOR QUANTITATIVELY EVALUATING AMOUNT OF DISPERSION MEDIUM ADSORBED TO DISPERSOID PARTICLES

TECHNICAL FIELD

The present invention relates to a dispersoid particle analyzing method and an analyzing apparatus for analyzing dispersoid particles (for example, a particulate) using volume susceptibilities (magnetic susceptibilities per unit volume) of the dispersoid particles.

BACKGROUND ART

The present inventors proposed a method for measuring a voidage of a dispersoid particle using a volume susceptibility of the dispersoid particle (Patent Literature 1). The present inventors also proposed a method for measuring a surface area of a dispersoid particle, the number of pores formed in the dispersoid particle, and respective average values of diameters, depths, and volumes of the pores using a volume susceptibility of the dispersoid particle (Patent Literature 2).

CITATION LIST

Patent Literature

[Patent Literature 1] International Publication No. 2013/021910
[Patent Literature 2] International Publication No. 2015/030184

SUMMARY OF INVENTION

Technical Problem

The inventors have accomplished the present invention through continuous diligent study on a method for analyzing a dispersoid particle. The present invention accordingly has its object of providing a dispersoid particle analyzing method and an analyzing apparatus for evaluating affinity of a dispersoid particle for a dispersion medium in a quantitative manner using a volume susceptibility of the dispersoid particle.

Solution to Problem

A first dispersoid particle analyzing method according to the present invention includes: obtaining volume susceptibilities of respective dispersoid particles dispersed in a dispersion medium by magnetophoresis; and analyzing affinity of the dispersoid particles for the dispersion medium using the volume susceptibilities of the respective dispersoid particles and a volume susceptibility of the dispersion medium.

In one embodiment, in the analyzing affinity, the affinity of the dispersoid particles for the dispersion medium is analyzed through comparison between the volume susceptibilities of the respective dispersoid particles and the volume susceptibility of the dispersion medium.

In one embodiment, in the analyzing affinity, the affinity of the dispersoid particles for the dispersion medium is analyzed using differences in volume susceptibility between the respective dispersoid particles and the dispersion medium.

A second dispersoid particle analyzing method according to the present invention includes: obtaining particle diameters of respective dispersoid particles dispersed in a dispersion medium; obtaining volume susceptibilities of the respective dispersoid particles in the dispersion medium by magnetophoresis; and analyzing affinity of the dispersoid particles for the dispersion medium based on the particle diameters, a distribution of the volume susceptibilities of the respective dispersoid particles, a width of the distribution, and a volume susceptibility of the dispersion medium.

In one embodiment, the analyzing affinity includes: obtaining a regression line indicating a relationship between the particle diameters and the distribution of the volume susceptibilities of the respective dispersoid particles. The affinity of the dispersoid particles for the dispersion medium is then analyzed based on the width of the distribution of the volume susceptibilities of the respective dispersoid particles around the regression line.

In one embodiment, in the analyzing affinity, the affinity of the dispersoid particles for the dispersion medium is analyzed based on a width of a distribution of the particle diameters of the respective dispersoid particles.

A first analyzing apparatus according to the present invention includes a magnetic field generating section, a measurement section, and an operation section. The measurement section measures movement of a dispersoid particle of dispersoid particles dispersed in a dispersion medium while the magnetic field generating section generates a magnetic field. The operation section obtains volume susceptibilities of the respective dispersoid particles based on a measurement result by the measurement section. The operation section generates image data indicating a distribution of the volume susceptibilities of the respective dispersoid particles.

In one embodiment, the operation section generates image data indicating differences in volume susceptibility between the respective dispersoid particles and the dispersion medium.

In one embodiment, the operation section obtains particle diameters of the respective dispersoid particles in the dispersion medium. Further, the operation section generates image data indicating a distribution of the volume susceptibilities of the respective dispersoid particles each plotted for a corresponding one of the particle diameters.

In one embodiment, the operation section obtains a regression line indicating a relationship between the particle diameters and the distribution of the volume susceptibilities of the respective dispersoid particles. Further, the operation section generates the image data that includes the regression line.

A second analyzing apparatus according to the present invention includes a magnetic field generating section, a measurement section, and an operation section. The measurement section measures movement of a dispersoid particle of dispersoid particles dispersed in a dispersion medium while the magnetic field generating section generates a magnetic field. The operation section obtains volume susceptibilities of the respective dispersoid particles based on a measurement result by the measurement section. The operation section analyzes affinity of the dispersoid particles for the dispersion medium through analysis of a distribution of the volume susceptibilities of the respective dispersoid particles.

In one embodiment, the operation section analyzes the affinity of the dispersoid particles for the dispersion medium through analysis of a distribution of differences in volume susceptibility between the respective dispersoid particles and the dispersion medium.

In one embodiment, the operation section obtains particle diameters of the respective dispersoid particles in the dispersion medium. Further, the operation section analyzes the distribution of the volume susceptibilities versus the particle diameters of the respective dispersoid particles.

In one embodiment, the operation section obtains an approximate function indicating a relationship between the particle diameters and the volume susceptibilities of the respective dispersoid particles. Further, the operation section analyzes the distribution of the volume susceptibilities versus the particle diameters of the respective dispersoid particles using the approximate function.

Advantageous Effects of Invention

According to the present invention, affinity of a dispersoid particle for a dispersion medium can be evaluated in a quantitative manner using a volume susceptibility of the dispersoid particle.

DESCRIPTION OF EMBODIMENTS

Figure 1:
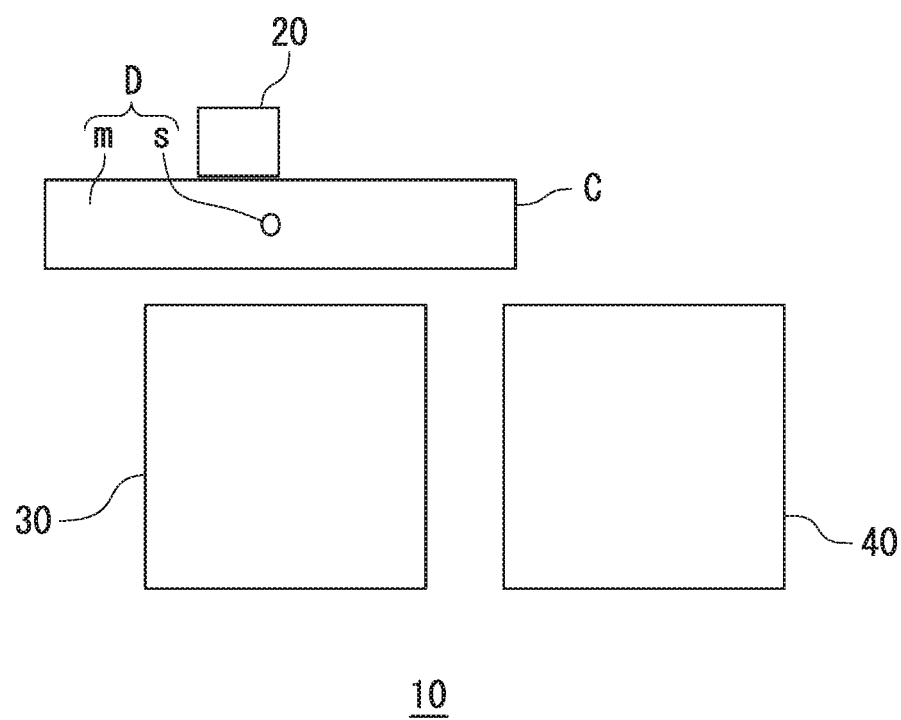
FIG. 1 is a schematic diagram illustrating an analyzing apparatus according to an embodiment of the present invention.

The following describes embodiments of the present invention with reference to the accompanying drawings. Like numerals denote like elements or corresponding elements in the drawings, and description thereof is not repeated. Furthermore, the present invention is not limited to the embodiments described below and various alterations can be made within the scope not departing from the essence of the present invention.

First Embodiment

A dispersoid particle analyzing method according to the first embodiment includes a process of obtaining volume susceptibilities $\chi s$ of dispersoid particles s (also referred to below as dispersoid volume susceptibilities $\chi s$) dispersed in a dispersion medium m by magnetophoresis. The dispersoid particle analyzing method according to the first embodiment further includes a process of analyzing affinity of the dispersoid particles s for the dispersion medium m using the dispersoid volume susceptibilities $\chi s$ and a volume susceptibility $\chi m$ of the dispersion medium m (also referred to below as dispersion medium volume susceptibility $\chi m$). In the process of analyzing the affinity of the dispersoid particles s for the dispersion medium m in the first embodiment, the affinity of the dispersoid particles s for the dispersion medium m is analyzed through comparison or using a difference between the dispersoid volume susceptibility $\chi s$ and the dispersion medium volume susceptibility $\chi m$.

The dispersion medium m is water, for example. Alternatively, the dispersion medium m may be selected from methanol, ethanol, 1-propanol, acetonitrile, acetone, and the like. Alternatively, the dispersion medium m may be a mixture of two or more of water, methanol, ethanol, 1-propanol, acetonitrile, acetone, and the like. The dispersoid particles s are porous silica gel particles or cellulose, for example. Alternatively, the dispersoid particles s may be made of a resin such as polyethylene or polystyrene. Or, the dispersoid particles s may be silica particles to be used as spacers in a liquid crystal panel. Alternatively, the dispersoid particles s may be organic-inorganic hybrid particles in which organic matter and inorganic matter are present, such as an ink or a toner. Or, the dispersoid particles s may be made of an electrode material such as carbon or tungsten oxide. Alternatively, the dispersoid particles s may be made of a food material such as whipped cream, starch, or sucrose. Or, the dispersoid particles s may be droplets of hexane, benzene, toluene, olive oil, or the like.

Figure 2:
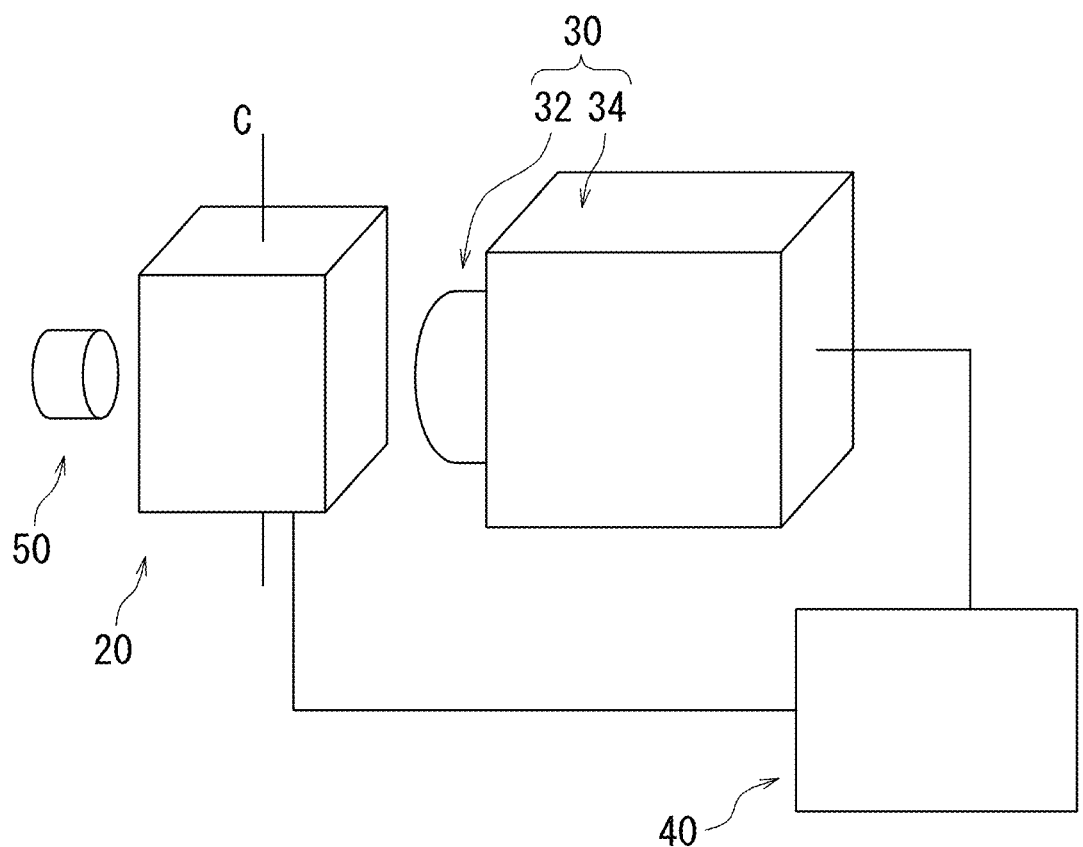
FIG. 2 is a schematic diagram illustrating a measurement section according to the embodiment of the present invention.

Description will be made below with reference to FIGS. 1 and 2 about a method for obtaining a dispersoid volume susceptibility $\chi s$ by magnetophoresis. FIG. 1 is a schematic diagram illustrating an analyzing apparatus 10 according to the present embodiment. The analyzing apparatus 10 is used in the dispersoid particle analyzing method according to the present embodiment.

The analyzing apparatus 10 incudes a magnetic field generating section 20, a measurement section 30, and an operation section 40. A disperse system D that is the dispersion medium m in which the dispersoid particles s are dispersed is disposed in the vicinity of the magnetic field generating section 20. The disperse system D is put into a tubular member, for example. Specifically, a capillary C into which the disperse system D is put is disposed in the vicinity of the magnetic field generating section 20. The capillary C is made of glass, for example. Furthermore, the capillary C may have a substantially square shape that measures about 100 μm square in section perpendicular to an axial direction thereof. The dispersoid particles s in a state of being dispersed in the dispersion medium m are introduced into the capillary C by the capillary action or a pump. However, the capillary C is not limited to a glass-made capillary having a square section. The capillary C may have any shape as long as magnetic migration of the dispersoid particles s in the capillary C is observable. The capillary C may be made of any material as long as magnetic migration of the dispersoid particles s in the capillary C is observable.

The magnetic field generating section 20 includes a superconducting magnet, a magnetic circuit, a permanent magnet, or the like. For example, the magnetic field generating section 20 preferably generates a strong magnetic field having a large magnetic field gradient using pole pieces. Note that although a single dispersoid particle s is illustrated in FIG. 1, a plurality of dispersoid particles s may be present in the dispersion medium m.

Once the magnetic field generating section 20 generates a magnetic field in the disperse system D, the dispersoid particles s perform magnetic migration in the dispersion medium m. The measurement section 30 measures movement (magnetic migration) of a dispersoid particle s in the dispersion medium m (disperse system D) while the magnetic field generating section 20 generates the magnetic field.

The operation section 40 is a personal computer, for example. The operation section 40 obtains a magnetic migration speed v of the dispersoid particle s from a measurement result by the measurement section 30. For example, the operation section 40 may obtain the magnetic migration speed v from time-varying positional change of the dispersoid particle s measured by the measurement section 30. Specifically, it is possible that the measurement section 30 images the dispersoid particle s at predetermined time intervals and the operation section 40 obtains the magnetic migration speed v from results of the imaging.

The operation section 40 obtains a dispersoid volume susceptibility $\chi s$ from the magnetic migration speed v. Specifically, the operation section 40 calculates the dispersoid volume susceptibility $\chi s$ by referencing the following equation (1).

$$v = 2(\chi s - \chi m) r^2 (1/9 \eta \mu_0) B(dB/dx) \quad (1)$$

In equation (1): r represents a radius of the dispersoid particle s; $\eta$ represents a viscosity coefficient of the dispersion medium m; $\mu_0$ represents a vacuum magnetic permeability; and $B(dB/dx)$ represents a magnetic field gradient.

A literature value can be used as the radius r of the dispersoid particle s. Alternatively, the radius r of the dispersoid particle s may be obtained through measurement. For example, the radius r of the dispersoid particle s can be measured from an image of the dispersoid particle s imaged by the measurement section 30. The viscosity coefficient $\eta$ of the dispersion medium m and the vacuum magnetic permeability $\mu_0$ each are a constant, and a literature value can be used as the dispersion medium volume susceptibility $\chi m$. Alternatively, the dispersion medium volume susceptibility $\chi m$ may be measured using a superconducting quantum interference device (SQUID) element or a magnetic balance. The magnetic field gradient $B(dB/dx)$ is an apparatus constant and measurable.

Description will be made next about configuration of the measurement section 30 with reference to FIG. 2. FIG. 2 is a schematic diagram illustrating the configuration of the measurement section 30. As illustrated in FIG. 2, the measurement section 30 includes a zooming section 32 and an imaging section 34. The dispersoid particles s introduced into the capillary C are zoomed up to an appropriate magnification by the zooming section 32 and imaged by the imaging section 34. For example, the zooming section 32 includes an objective lens and the imaging section 34 includes a charge coupled device (CCD). Note that provision of the imaging section 34 in the measurement section 30 enables measurement of not only the position but also the particle diameter of the dispersoid particle s. In a configuration in which the radius r of the dispersoid particle s is measured using the measurement section 30, the analyzing apparatus 10 preferably includes a light source 50 that irradiates the capillary C. The light source 50 is not particularly limited and may be a laser light source, for example. Use of a laser light source as the light source 50 can enable analysis of a magnetic migration speed v of the dispersoid particle s by the Laser Doppler method. In a configuration in which the magnetic migration speed v is analyzed by the Laser Doppler method, the imaging section 34 includes a photo multiplier tube. Furthermore, use of a laser light source as the light source 50 can enable analysis of the particle diameter of the dispersoid particle s by a dynamic light scattering method. In a configuration in which the particle size of the dispersoid particle s is analyzed by the dynamic light scattering method, the imaging section 34 includes a photo multiplier tube.

Description will be made next with reference to FIGS. 3-5 about a method for analyzing affinity of the dispersoid particles s for the dispersion medium m through comparison between the dispersoid volume susceptibility $\chi s$ and the dispersion medium volume susceptibility $\chi m$.

Figure 3:
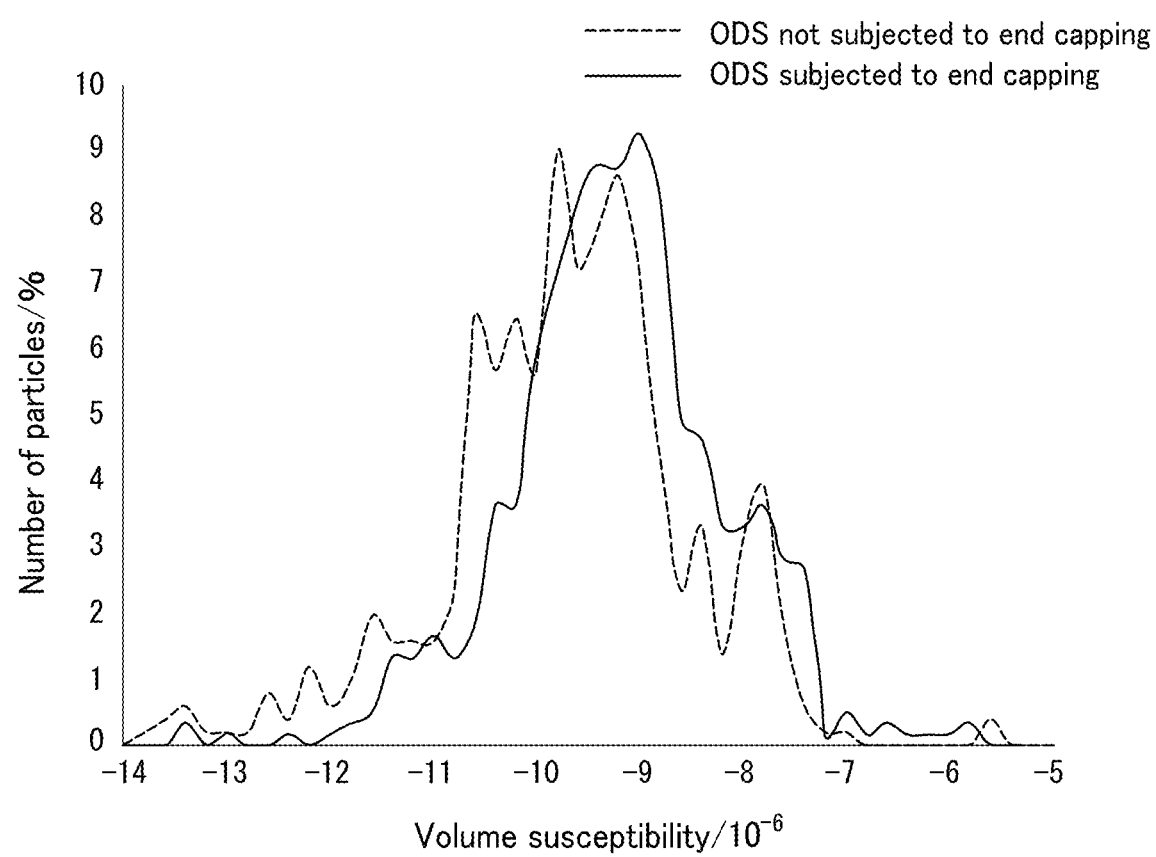
FIG. 3 is a graph representation indicating first and second distributions of dispersoid volume susceptibilities according to the embodiment of the present invention.

FIG. 3 is a graph representation indicating a first distribution (broken line) and a second distribution (solid line) of dispersoid volume susceptibilities $\chi s$. Specifically, the first distribution (broken line) of the dispersoid volume susceptibilities $\chi s$ is obtained in a situation in which octadecyl group bonded silica gel (ODS) particles that are dispersoid particles s are dispersed in acetone that is a dispersion medium m. By contrast, the second distribution (solid line) of the dispersoid volume susceptibilities $\chi s$ is obtained in a situation in which octadecyl group bonded silica gel (ODS) particles subjected to end capping (dispersoid particles s) are dispersed in acetone (a dispersion medium m).

In FIG. 3, the horizontal axis represents the dispersoid volume susceptibility $\chi s$ and the vertical axis represents a rate of the number of particles. The operation section 40 described with reference to FIG. 1 generates image data of the graphs indicated in FIG. 3 through obtaining information on the volume susceptibilities $\chi s$ of the respective particles as the dispersoid particles s in the disperse system D (dispersion medium m). The image based on the image data generated by the operation section 40 is output through an output device such as a display or a printer.

The ODS particles are produced by causing a silanol group present on the surfaces of porous silica gel particles to react with an octadecylsilane compound. The silanol group includes a hydroxyl group (OH), and reaction of the silanol group with the octadecylsilane compound makes the porous silica gel particles hydrophobic. However, not all part of the silanol group on the surfaces of the porous silica gel particles can react with the octadecylsilane compound. For the reason as above, end capping is performed in a situation in which it is necessary to make the porous silica gel particles more hydrophobic. The end capping is a treatment by which a silane compound such as trimethyl monochlorosilane is caused to react with a remaining part of the silanol group.

Note that it is difficult to thoroughly remove the remaining part of the silanol group even by end capping.

As indicated in FIG. 3, comparison of the first distribution (broken line) and the second distribution (solid line) of the dispersoid volume susceptibilities $\chi s$ with the volume susceptibility $\chi m$ of acetone $(-5.77 \times 10^{-6})$ can find that the second distribution (solid line) is closer to the volume susceptibility $\chi m$ of acetone than the first distribution (broken line). That is, the volume susceptibilities $\chi s$ (sloid line) of the ODS particles subjected to end capping is closer to the volume susceptibility $\chi m$ of acetone than the volume susceptibilities $\chi s$ (broken line) of the ODS particles not subjected to end capping. In other words, when the ODS particles are subjected to end capping to be more hydrophobic, the dispersoid volume susceptibilities $\chi s$ thereof become close to the volume susceptibility $\chi m$ of acetone. This indicates that end capping increases the affinity of the ODS particles (dispersoid particles s) for acetone (dispersion medium m).

That is, the dispersoid volume susceptibility $\chi s$ being close to the dispersion medium volume susceptibility $\chi m$ indicates that a large amount of the dispersion medium m is adsorbed to the surfaces of the dispersoid particles s. A large amount of the dispersion medium m being adsorbed to the surfaces of the dispersoid particles s indicates strong affinity of the dispersoid particles s for the dispersion medium m.

Note that the dispersoid volume susceptibility $\chi s$ is close to the dispersion medium volume susceptibility $\chi m$ as the amount of the dispersion medium m adsorbed to the surfaces of the dispersoid particles s is increased since the additivity property is true for the volume susceptibility. For example, the volume susceptibility $\chi s$ of a porous material (dispersoid particle s) having a surface that is modified with modifying molecules, such as an ODS particle is represented by the following equation (2).

$$\chi s = \chi_B(V_B/Vs) + \chi_M(V_M/Vs) + \chi m(Vm/Vs) \quad (2)$$

In equation (2): Vs represents a volume of the dispersoid particle s; $V_B$ represents a volume of a skeletal portion of the dispersoid particle s; $V_M$ represents a volume occupied by modifying molecules that modify the surface of the dispersoid particle s; and Vm represents a volume occupied by the dispersion medium m adsorbed to the dispersoid particle s. Furthermore, $\chi_B$ represents a volume susceptibility of the skeletal portion of the dispersoid particle s; $\chi_M$ represents a volume susceptibility of the modifying molecules that modify the surface of the dispersoid particle s; and $\chi m$ represents a volume susceptibility of the dispersion medium m adsorbed to the dispersoid particle s.

As is clear from equation (2), the volume susceptibility $\chi s$ of the dispersoid particle s is close to the volume susceptibility $\chi m$ of the dispersion medium m as the ratio of the volume Vm of the dispersion medium m that occupies the volume Vs of the dispersoid particle s is increased, in other words, as the amount of the dispersion medium m adsorbed to the dispersoid particle s is increased.

As such, it can be evaluated that the ODS particles subjected to end capping display stronger affinity for the dispersion medium m than the ODS particles not subjected to end capping in a situation in which the dispersion medium m is acetone.

Note that the operation section 40 may analyze the affinity of the dispersoid particles s for the dispersion medium m through analysis of the distribution of the volume susceptibilities of the respective dispersoid particles s. For example, the operation section 40 may obtain a value (parameter) indicating the affinity of the dispersoid particles s for the dispersion medium m by calculation (numerical analysis) based on the volume susceptibilities $\chi s$ of the respective dispersoid particles s in the disperse system D (dispersion medium m) and the volume susceptibility $\chi m$ of the dispersion medium m.

Figure 4:
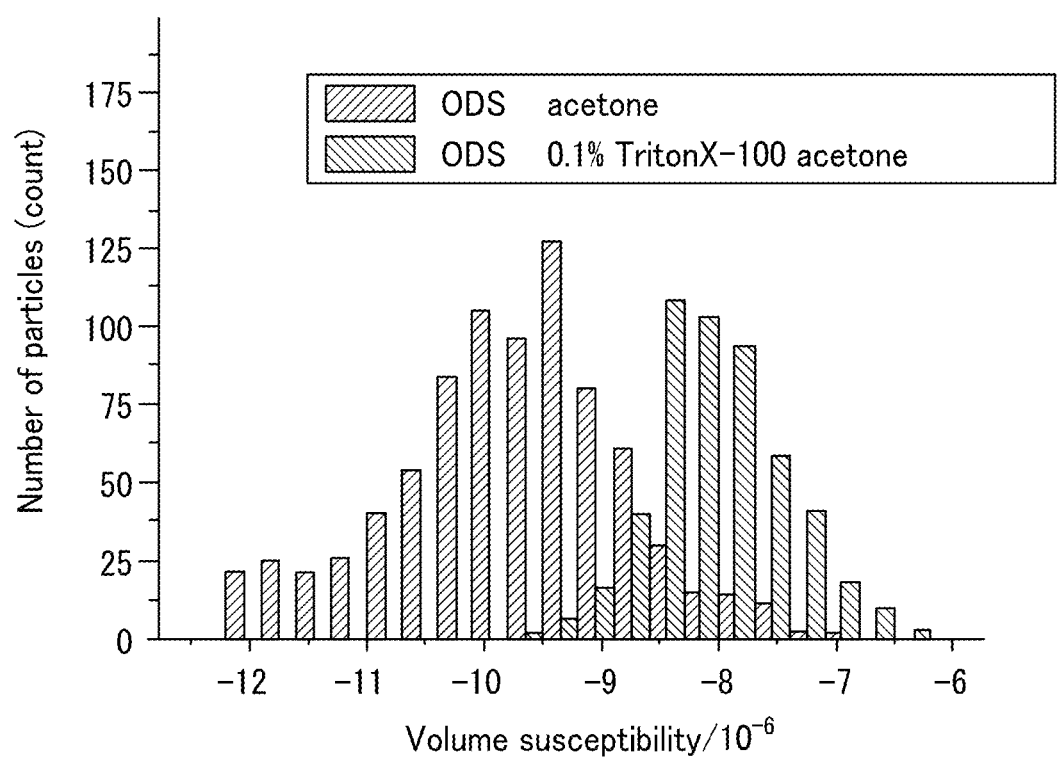
FIG. 4 is a graph representation indicating third and fourth distributions of dispersoid volume susceptibilities according to the embodiment of the present invention.

FIG. 4 is a graph representation (histogram) indicating third and fourth distributions of dispersoid volume susceptibilities $\chi s$. Specifically, the third distribution of the dispersoid volume susceptibilities $\chi s$ is obtained in a situation in which ODS particles are dispersed in acetone. By contrast, the fourth distribution of the dispersoid volume susceptibilities $\chi s$ is obtained in a situation in which ODS particles are dispersed in a solution of acetone with which 0.1% by mass of a surfactant TritonX-100 is mixed. In the third distribution, the dispersion medium m is acetone and the dispersoid particles s are the ODS particles. When the ODS particles are dispersed in the acetone with which the surfactant TritonX-100 is mixed, the surfactant TritonX-100 is adsorbed to the surfaces of the ODS particles. Accordingly, in the fourth distribution, the dispersion medium m is acetone and the dispersoid particles s are the ODS particles each having a surface to which the surfactant TritonX-100 is adsorbed.

In FIG. 4, the horizontal axis represents the dispersoid volume susceptibility $\chi s$ and the vertical axis represents the number of particles. The operation section 40 described with reference to FIG. 1 generates image data of the graphs indicated in FIG. 4 through obtaining information on the volume susceptibilities $\chi s$ of the respective particles as the dispersoid particles s in the disperse system D (dispersion medium m). The image based on the image data generated by the operation section 40 is output through an output device such as a display or a printer.

As indicated in FIG. 4, comparison of the third and fourth distributions of the dispersoid volume susceptibilities $\chi s$ with the volume susceptibility $\chi m$ of acetone $(-5.77 \times 10^{-6})$ can find that the fourth distribution is closer to the volume susceptibility $\chi m$ of acetone than the third distribution. That is, the volume susceptibilities $\chi s$ of the respective ODS particles each having a surface to which the surfactant TritonX-100 is adsorbed are closer to the volume susceptibility $\chi m$ of acetone than the volume susceptibilities $\chi s$ of the respective ODS particles. In other words, adsorption of the surfactant TritonX-100 to the surfaces of the ODS particles makes the dispersoid volume susceptibility $\chi s$ close to the dispersion medium volume susceptibility $\chi m$. This indicates that adsorption of the surfactant TritonX-100 to the surfaces of the ODS particles (dispersoid particles s) increases the affinity of the ODS particles (dispersoid particles s) for acetone (dispersion medium m).

As such, it can be evaluated that the ODS particles each having a surface to which the surfactant TritonX-100 is adsorbed display stronger affinity for the dispersion medium m than the ODS particles each having a surface to which the surfactant TritonX-100 is not adsorbed in a situation in which the dispersion medium m is acetone.

Figure 5:
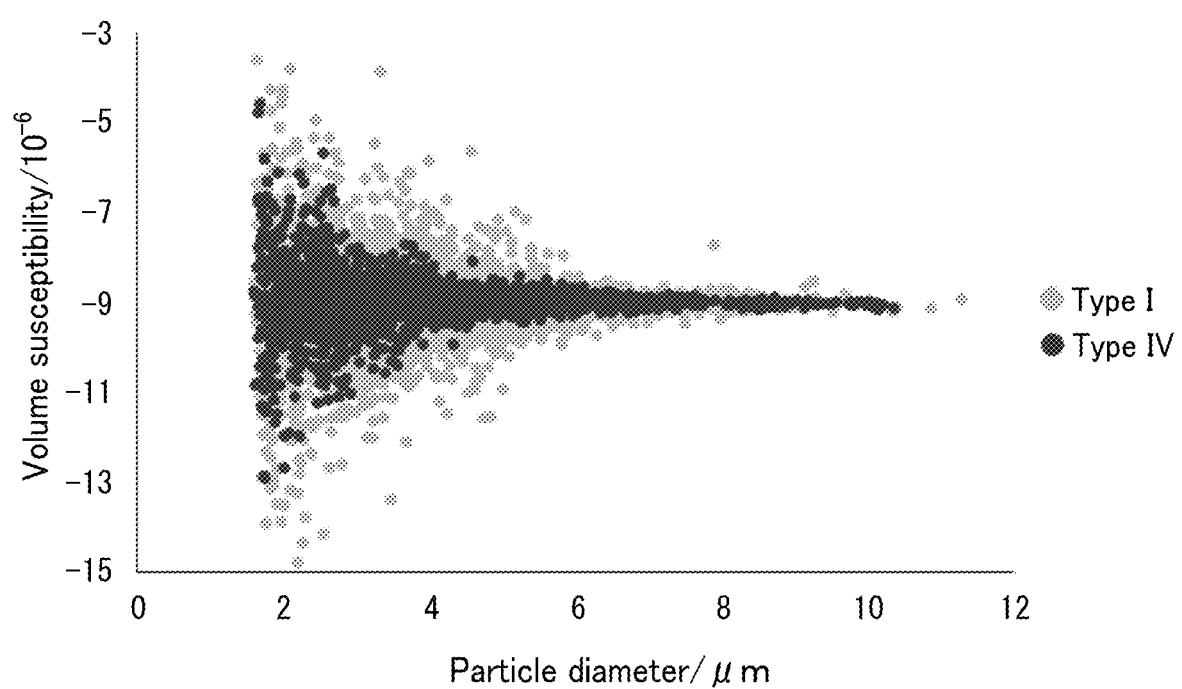
FIG. 5 is a graph representation showing fifth and sixth distributions of dispersoid volume susceptibilities according to the embodiment of the present invention.

FIG. 5 is a graph representation (scatter diagram) indicating fifth and sixth distributions of dispersoid volume susceptibilities $\chi s$. Specifically, FIG. 5 indicates two distributions of dispersoid volume susceptibilities $\chi s$ each plotted for corresponding one of particle diameters. In FIG. 5, the horizontal axis represents the particle diameter and the vertical axis represents the dispersoid volume susceptibility $\chi s$. The operation section 40 described with reference to FIG. 1 generates image data of the graphs indicated in FIG. 5 through obtaining information on the volume susceptibilities $\chi s$ of the respective dispersoid particles s and information on the particle diameters of the respective dispersoid particles s in the disperse system D (dispersion medium m). That is, the operation section 40 generates image data indicating a distribution of the volume susceptibilities $\chi$s of the dispersoid particles s each plotted for corresponding one of particle diameters. The image based on the image data generated by the operation section 40 is output through an output device such as a display or a printer.

Specifically, the fifth distribution of the dispersoid volume susceptibilities $\chi$s indicates a relationship between dispersoid volume susceptibilities $\chi$s and particle diameters of particles obtained through dispersion of an anticonvulsant, carbamazepine I (dispersoid particles s) in water (dispersion medium m). By contrast, the sixth distribution of the dispersoid volume susceptibilities $\chi$s indicates a relationship between dispersoid volume susceptibilities $\chi$s and particle diameters of particles obtained through dispersion of an anticonvulsant, carbamazepine IV (dispersoid particles s) in water (dispersion medium m).

As indicated in FIG. 5, comparison between the volume susceptibilities $\chi$s of the fifth distribution (I) and the volume susceptibilities $\chi$s of the sixth distribution (IV) with the volume susceptibility $\chi$m ($-9.01\times10^{-6}$) of water can find that the volume susceptibilities $\chi$s of the sixth distribution (IV) are closer to the volume susceptibility $\chi$m of water than those of the fifth distribution (I). That is, the volume susceptibility $\chi$s of the anticonvulsant, carbamazepine IV is closer to the volume susceptibility $\chi$m of water than that $\chi$s of the anticonvulsant, carbamazepine I. As such, it can be evaluated that the anticonvulsant, carbamazepine IV has stronger affinity for water than the anticonvulsant, carbamazepine I.

Description will be made next with reference to FIGS. 6 and 7 about a method for analyzing affinity of the dispersoid particles s for the dispersion medium m using a difference between the dispersoid volume susceptibility $\chi$s and the dispersion medium volume susceptibility $\chi$m.

Figure 6:
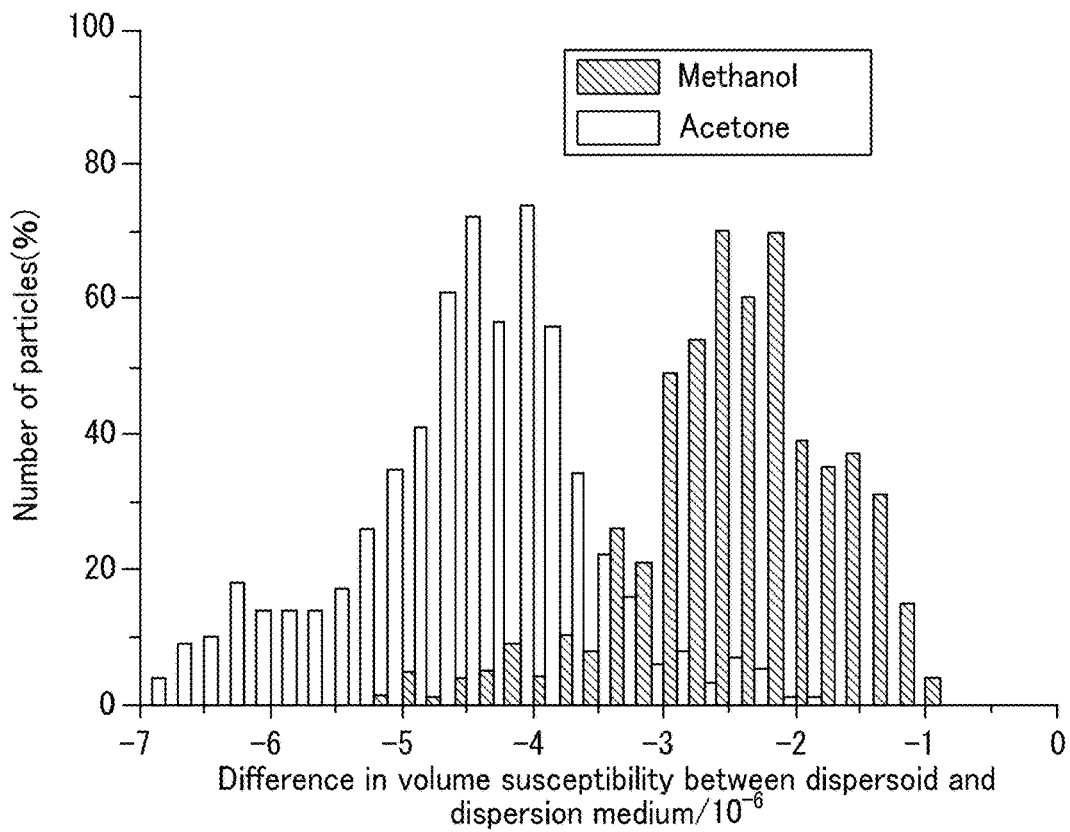
FIG. 6 is a graph representation indicating seventh and eighth distributions of dispersoid volume susceptibilities according to the embodiment of the present invention.

FIG. 6 is a graph representation (histogram) indicating seventh and eighth distributions of dispersoid volume susceptibilities $\chi$s. Specifically, FIG. 6 indicates two distributions of differences between the dispersion medium volume susceptibility $\chi$m and the dispersoid volume susceptibility $\chi$s (also referred to below as volume susceptibility differences). In FIG. 6, the horizontal axis represents the volume susceptibility difference and the vertical axis represents a rate of the number of particles. The operation section 40 described with reference to FIG. 1 generates image data of the graphs indicated in FIG. 6 through obtaining information on the volume susceptibility $\chi$m of the dispersion medium m and information on the volume susceptibilities $\chi$s of the respective dispersoid particles s in the disperse system D (dispersion medium m). That is, the operation section 40 generates image data indicating a volume susceptibility difference. The image based on the image data generated by the operation section 40 is output through an output device such as a display or a printer.

Specifically, FIG. 6 indicates a distribution (seventh distribution) of differences between the volume susceptibility $\chi$m ($-6.65\times10^{-6}$) of methanol that is a dispersion medium m and dispersoid volume susceptibilities $\chi$s of porous silica gel particles that are dispersoid particles s dispersed in the methanol (the dispersion medium m). FIG. 6 also indicates a distribution (eighth distribution) of differences between the volume susceptibility $\chi$m of acetone that is a dispersion medium m and dispersoid volume susceptibilities $\chi$s of porous silica gel particles that are dispersoid particles s dispersed in the acetone (dispersion medium m).

As indicated in FIG. 6, the volume susceptibility differences are closer to zero in a situation in which the porous silica gel particles are dispersed in methanol (seventh distribution) than in a situation in which the porous silica gel particles are dispersed in acetone (eighth distribution). This indicates that the volume susceptibilities $\chi$s of the porous silica gel particles are closer to the volume susceptibility $\chi$m of methanol than to the volume susceptibility $\chi$m of acetone. It can be evaluated accordingly that the porous silica gel particles have stronger affinity for methanol than for acetone.

Note that the operation section 40 may obtain differences between the volume susceptibility $\chi$m of the dispersion medium m and the volume susceptibilities $\chi$s of the respective dispersoid particles s in the disperse system D (dispersion medium m), analyze a distribution of the obtained differences (distribution of volume susceptibility differences), and obtain a value (parameter) indicating affinity of the dispersoid particles s for the dispersion medium m by calculation (numerical analysis).

Figure 7:
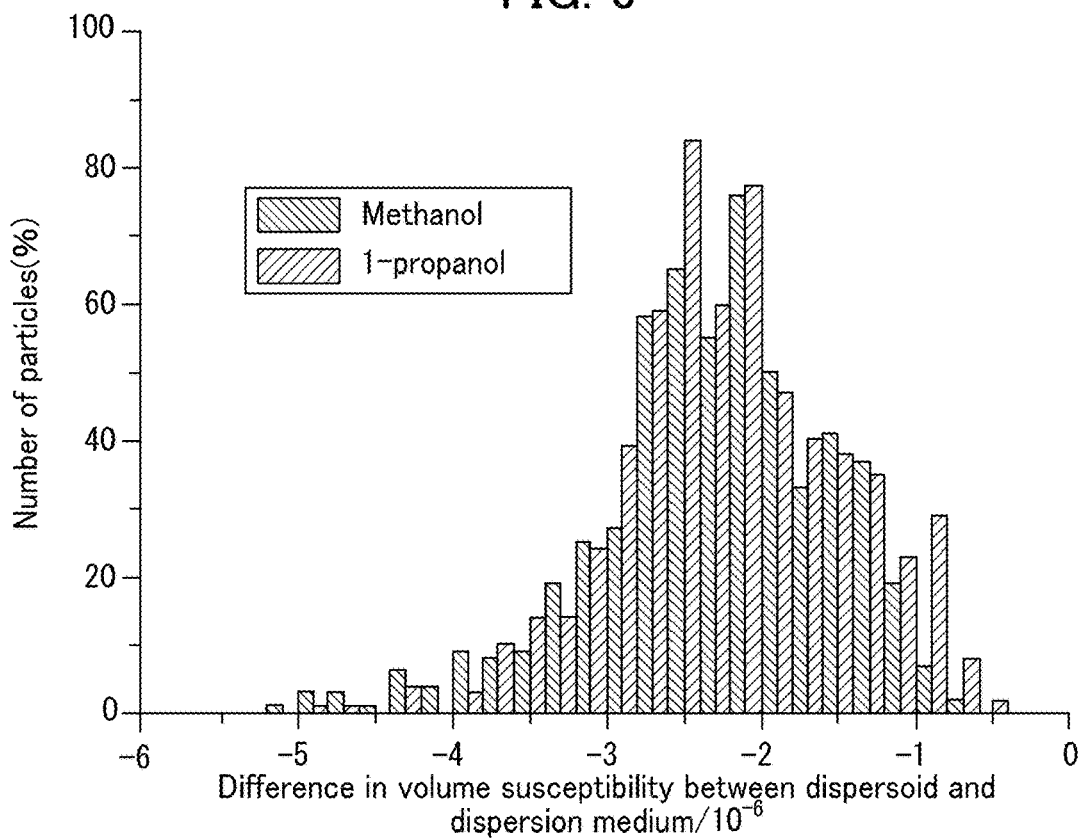
FIG. 7 is a graph representation indicating ninth and tenth distributions of dispersoid volume susceptibilities according to the embodiment of the present invention.
Figure 8:
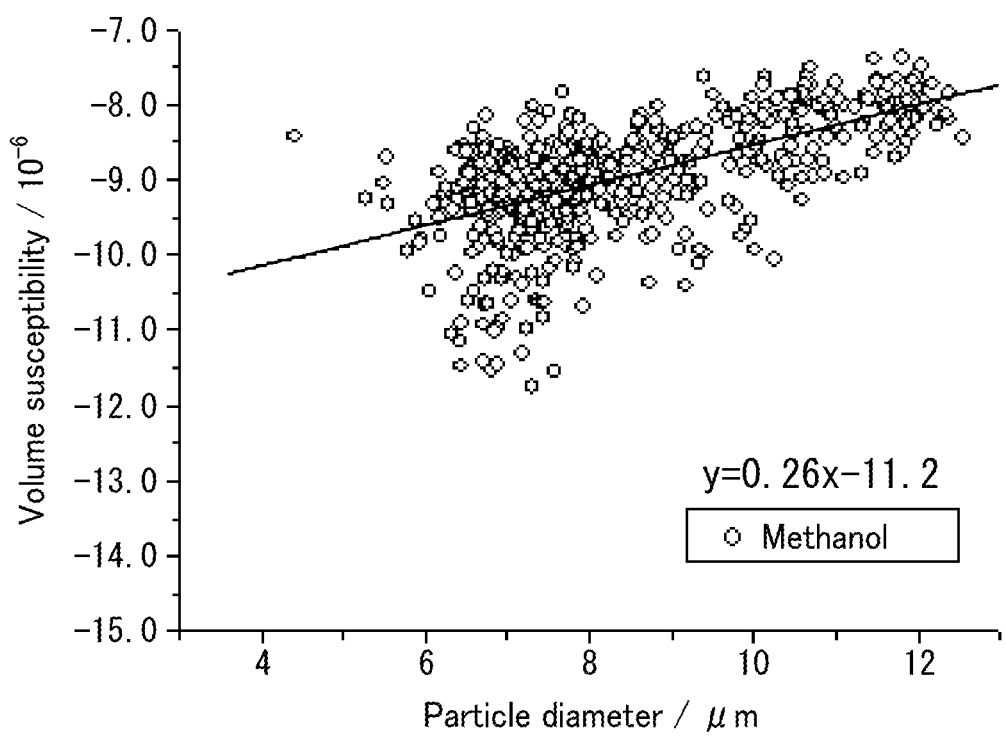
FIG. 8 is a graph representation indicating an eleventh distribution of dispersoid volume susceptibilities according to an embodiment of the present invention.

FIG. 7 is a graph representation (histogram) indicating ninth and tenth distributions of dispersoid volume susceptibilities $\chi$s. Specifically, FIG. 7 indicates two distributions of volume susceptibility differences. In FIG. 7, the horizontal axis represents volume susceptibility difference and the vertical axis represents a rate of the number of particles. The operation section 40 described with reference to FIG. 1 generates image data of the graphs indicated in FIG. 7 through obtaining information on the volume susceptibilities $\chi$s of the respective dispersoid particles s in the disperse system D (dispersion medium m) and information on the volume susceptibility $\chi$m of the dispersion medium m. That is, the operation section 40 generates image data indicating a volume susceptibility difference. The image based on the image data generated by the operation section 40 is output through an output device such as a display or a printer.

Specifically, FIG. 7 indicates a distribution (ninth distribution) of differences between the volume susceptibility $\chi$m of methanol that is a dispersion medium m and dispersoid volume susceptibilities $\chi$s of respective porous silica gel particles that are dispersoid particles s dispersed in the methanol. FIG. 7 also indicates a distribution (tenth distribution) of differences between the volume susceptibility $\chi$m ($-7.48\times10^{-6}$) of 1-propanol that is a dispersion medium m and dispersoid volume susceptibilities $\chi$s of respective porous silica gel particles that are dispersoid particles s dispersed in the 1-propanol.

As indicated in FIG. 7, difference is small between the distribution (ninth distribution) of the volume susceptibility differences obtained in a situation in which the porous silica gel particles are dispersed in methanol and the distribution (tenth distribution) of the volume susceptibility differences obtained in a situation in which the porous silica gel particles are dispersed in 1-propanol. This indicates that difference in affinity of the porous silica gel particles is small between for methanol and for 1-propanole.

As described above, the affinity of the dispersoid particles s for the dispersion medium m can be evaluated in a quantitative manner using the volume susceptibility $\chi$m of the dispersion medium m and the volume susceptibilities $\chi$s of the dispersoid particles s in the dispersion medium m in the first embodiment. The stronger the affinity of the dispersoid particles s for the dispersion medium m is, the higher the dispersibility of the dispersoid particles s in the dispersion medium m is. As such, the first embodiment can enable quantitative evaluation of the dispersibility of the dispersoid particles s.

Second Embodiment

Description will be made next about a dispersoid particle analyzing method according to a second embodiment with reference to FIGS. 8-15. The focus will be placed on matter different from the first embodiment, and some explanations overlapping with those explained in the first embodiment may be appropriately omitted. The dispersoid particle analyzing method according to the second embodiment is different from that according to the first embodiment in the process of analyzing affinity of dispersoid particles s for a dispersion medium m. Specifically, the dispersoid particle analyzing method according to the second embodiment includes a process of obtaining particle diameters of respective dispersoid particles s in the dispersion medium m. The dispersoid particle analyzing method according to the second embodiment further includes a process of obtaining volume susceptibilities $\chi s$ of the respective dispersoid particles s in the dispersion medium m by magnetophoresis. The dispersoid particle analyzing method according to the second embodiment still includes a process of analyzing affinity of the dispersoid particles s for the dispersion medium m based on the particle diameters, a distribution of the volume susceptibilities $\chi s$ of the respective dispersoid particles s, a width of the distribution, and the volume susceptibility $\chi m$ of the dispersion medium m. In the process of analyzing affinity of the dispersoid particles s for the dispersion medium m in the second embodiment, a regression line is obtained that indicates a relationship between the particle diameters and the distribution of the volume susceptibilities $\chi s$ of the respective dispersoid particles s. The affinity of the dispersoid particles s for the dispersion medium m is then analyzed based on the width of the distribution of the volume susceptibilities $\chi s$ of the respective dispersoid particles s around the regression line. Alternatively, in the process of analyzing affinity of the dispersoid particles s for the dispersion medium m, the affinity of the dispersoid particles s for the dispersion medium m is analyzed based on a width of a distribution of the particle diameters of the dispersoid particles s.

FIGS. 8-11 are graph representations (scatter diagrams) indicating eleventh to fourteenth distributions of dispersoid volume susceptibilities $\chi s$, respectively. Specifically, FIGS. 8-11 each indicate a distribution of dispersoid volume susceptibilities $\chi s$ each plotted for corresponding one of particle diameters. In FIGS. 8-11, the horizontal axis represents the particle diameter and the vertical axis represents the dispersoid volume susceptibility $\chi s$. FIGS. 8-11 each indicate a regression line and an equation (approximate function) thereof. The approximate function (equation expressing the regression line) can be obtained by the least squares method, for example. The operation section 40 described with reference to FIG. 1 generates image data of the graphs and the regression lines indicated in FIGS. 8-11 through obtaining information on the volume susceptibilities $\chi s$ of the respective dispersoid particles s and information on the particle diameters of the respective dispersoid particles s in the disperse system D (dispersion medium m). That is, the operation section 40 obtains an approximate function (regression line) indicating the relationship between the particle diameters and the distribution of the volume susceptibilities $\chi s$ of the respective dispersoid particles s by calculation. Furthermore, the operation section 40 generates image data indicating a regression line and a distribution of the volume susceptibilities $\chi s$ of the respective dispersoid particles s each plotted for corresponding one of particle diameters. The image based on the image data generated by the operation section 40 is output through an output device such as a display or a printer.

Figure 9:
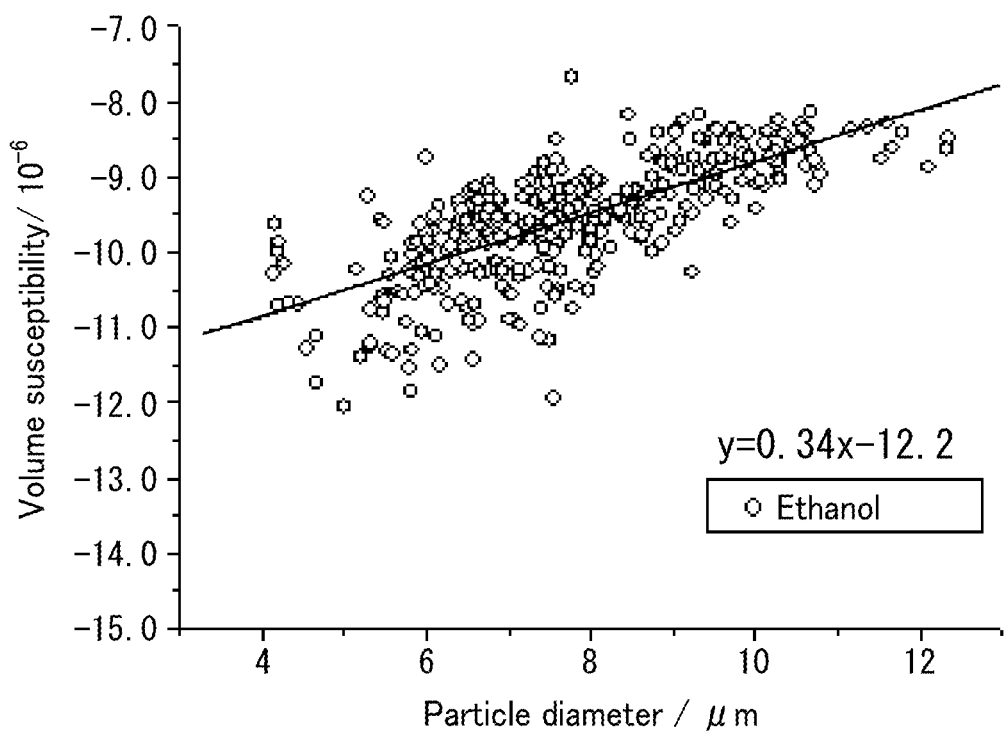
FIG. 9 is a graph representation indicating a twelfth distribution of dispersoid volume susceptibilities according to the embodiment of the present invention.
Figure 10:
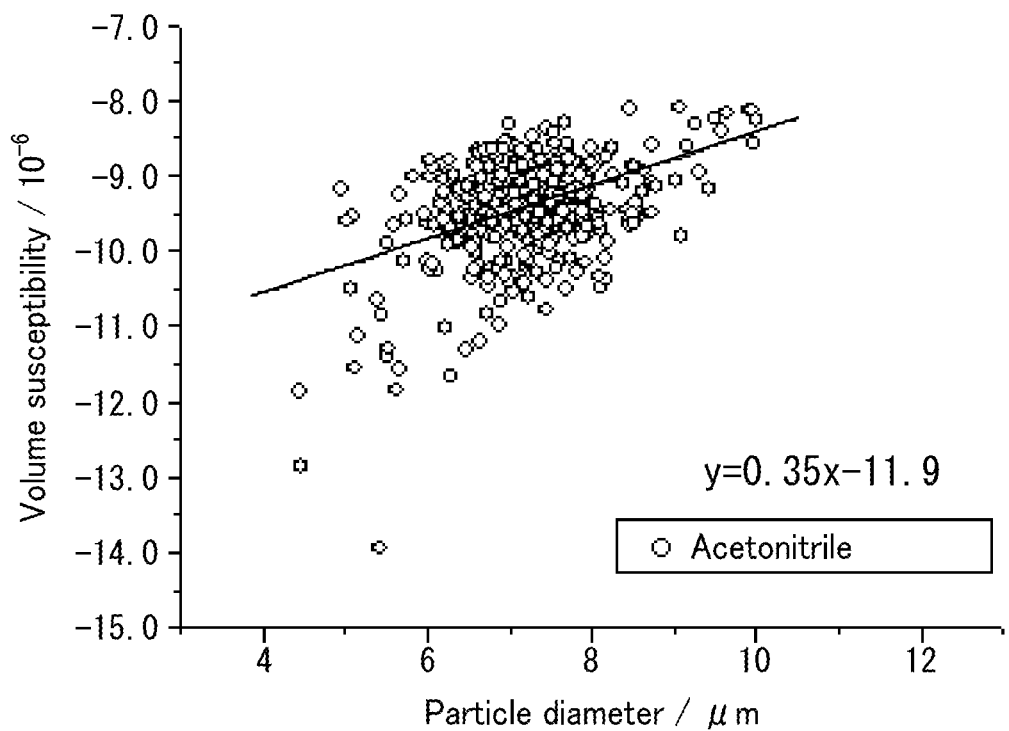
FIG. 10 is a graph representation indicating a thirteenth distribution of dispersoid volume susceptibilities according to the embodiment of the present invention.
Figure 11:
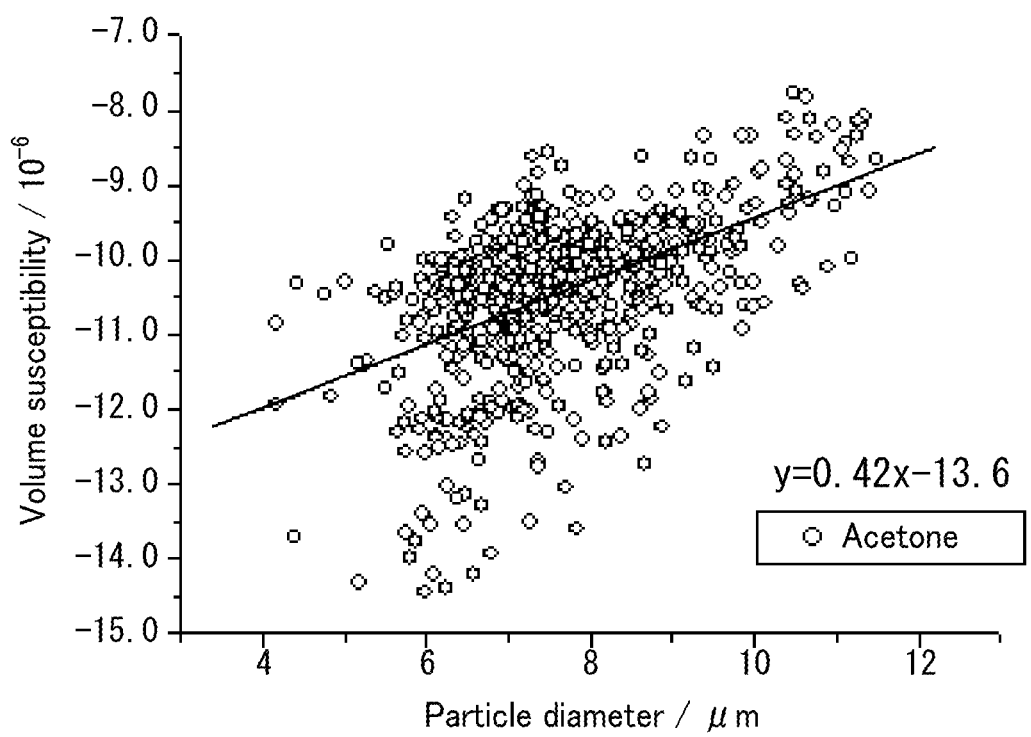
FIG. 11 is a graph representation indicating a fourteenth distribution of dispersoid volume susceptibilities according to the embodiment of the present invention.

Specifically, FIGS. 8-11 each indicate a relationship between particle diameters of porous silica gel particles that are dispersoid particles s and volume susceptibilities $\chi s$ of the porous silica gel particles s in a situation in which the porous silica gel particles are dispersed in a corresponding one of dispersion mediums m. That is, FIG. 8 indicates a relationship (eleventh distribution) between the particle diameters of the respective porous silica gel particles and the dispersoid volume susceptibilities $\chi s$ in a situation in which the porous silica gel particles are dispersed in methanol (dispersion medium m). FIG. 9 indicates a relationship (twelfth distribution) between the particle diameters of the respective porous silica gel particles and the dispersoid volume susceptibilities $\chi s$ in a situation in which the porous silica gel particles are dispersed in ethanol (dispersion medium m). FIG. 10 indicates a relationship (thirteenth distribution) between particle diameters of the respective porous silica gel particles and the dispersoid volume susceptibilities $\chi s$ in a situation in which the porous silica gel particles are dispersed in acetonitrile (dispersion medium m). FIG. 11 indicates a relationship (fourteenth distribution) between particle diameters of the respective porous silica gel particles and the dispersoid volume susceptibilities $\chi s$ in a situation in which the porous silica gel particles are dispersed in acetone (dispersion medium m).

As indicated in FIGS. 8-11, the larger the particle diameter is, the closer the dispersoid volume susceptibility $\chi s$ is to the dispersion medium volume susceptibility $\chi m$ in a situation in which the dispersoid particles s are porous particles. The reason thereof is that a total volume of pores formed in the dispersoid particle s increases as the particle diameter is increased. As such, an increase in total volume of the pores increases the amount of dispersion medium m adsorbed to the dispersoid particle s. Note that the volume susceptibility $\chi m$ of methanol is $-6.65 \times 10^{-6}$; the volume susceptibility $\chi m$ of ethanol is $-7.11 \times 10^{-6}$; the volume susceptibility $\chi m$ of acetonitrile is $-6.74 \times 10^{-6}$; and the volume susceptibility $\chi m$ of acetone is $-5.77 \times 10^{-6}$.

By contrast, the width of the distribution of the dispersoid volume susceptibilities $\chi s$ around the regression line differed due to difference in dispersion medium m. Specifically, the width (dispersion) of the distribution of the dispersoid volume susceptibilities $\chi s$ around the regression line is larger in a situation in which the dispersion medium m is acetone than in a situation in which the dispersion medium m is methanol, ethanol, or acetonitrile. This indicates that acetone is more hardly adsorbed to the surfaces of the porous silica gel particles than methanol, ethanol, and acetonitrile. In other words, the respective affinities of the porous silica gel particles for methanol, ethanol, and acetonitrile are stronger than that for acetone. That is, it indicates that the porous silica gel particles tend to be dispersed more in methanol, ethanol, and acetonitrile than in acetone.

Figure 12:
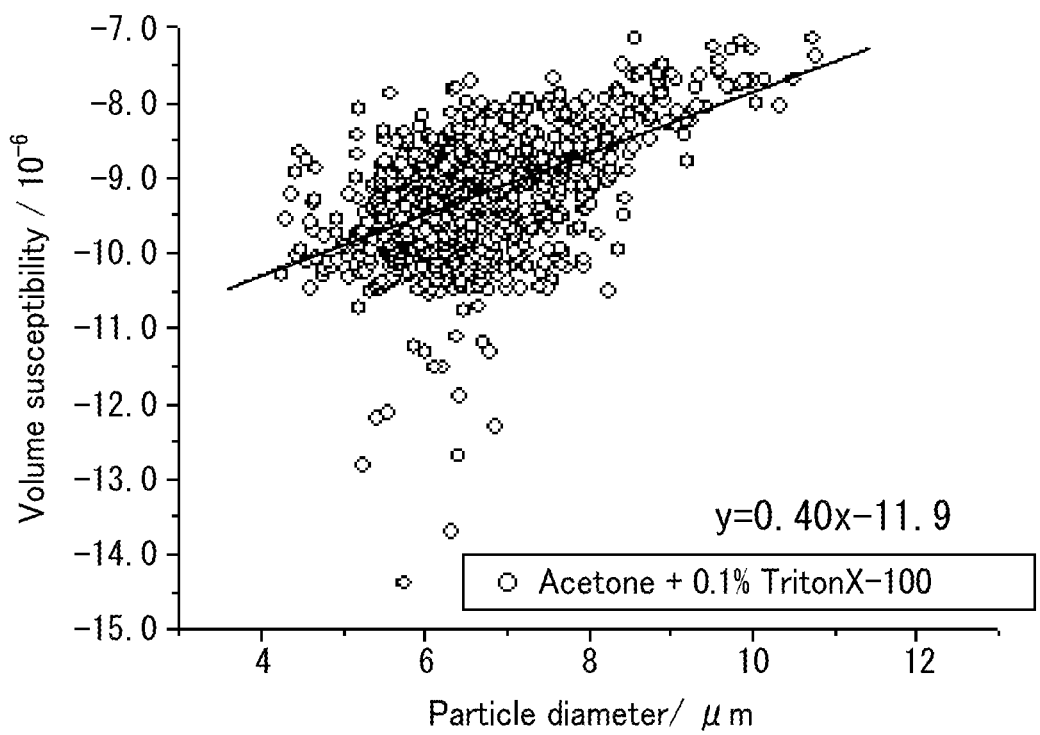
FIG. 12 is a graph representation indicating a fifteenth distribution of dispersoid volume susceptibilities according to the embodiment of the present invention.

FIG. 12 is a graph representation (scatter diagram) indicating a fifteenth distribution of dispersoid volume susceptibilities $\chi s$. Specifically, FIG. 12 indicates a distribution of dispersoid volume susceptibilities $\chi s$ each plotted for corresponding one of particle diameters. In FIG. 12, the horizontal axis represents the particle diameter and the vertical axis represents the dispersoid volume susceptibility $\chi s$. Furthermore, FIG. 12 indicates a regression line and an equation thereof (approximate function). The approximate function (equation expressing the regression line) can be obtained by the least squares method, for example. The operation section 40 described with reference to FIG. 1 generates image data of the graph and the regression line indicated in FIG. 12 through obtaining information on the volume susceptibilities $\chi s$ of respective dispersoid particles s and information on the particle diameters of thereof in the disperse system D (dispersion medium m). The image based on the image data generated by the operation section 40 is output through an output device such as a display or a printer.

Specifically, the fifteenth distribution of the dispersoid volume susceptibilities $\chi s$ indicates a relationship between the dispersoid volume susceptibilities $\chi s$ and the particle diameters of respective porous silica gel particles in a situation in which the porous silica gel particles are dispersed in a solution of acetone with which 0.1% by mass of a surfactant TritonX-100 is mixed. As indicated in FIGS. 11 and 12, mixing the surfactant TritonX-100 with acetone reduces the width of the distribution of the dispersoid volume susceptibilities $\chi s$ around the regression line. This indicates that the surfactant TritonX-100 is adsorbed to the surfaces of the porous silica gel particles to increase the affinity of the porous silica gel particles for acetone.

Figure 13:
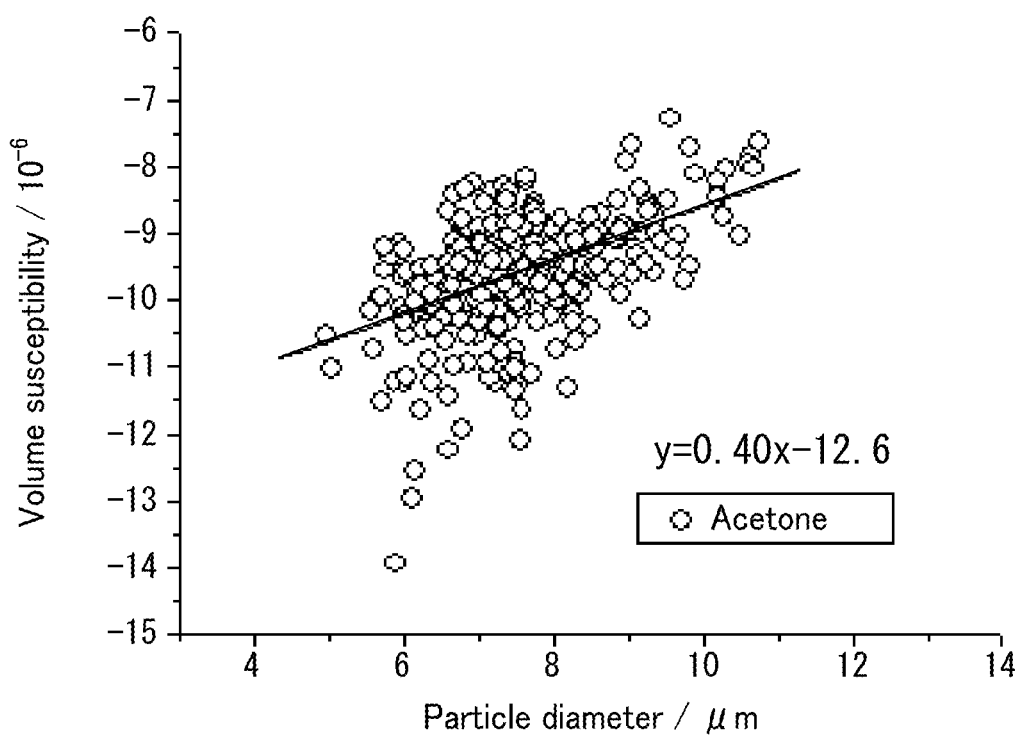
FIG. 13 is a graph representation indicating a sixteenth distribution of dispersoid volume susceptibilities according to the embodiment of the present invention.

FIG. 13 is a graph representation (scatter diagram) indicating a sixteenth distribution of the dispersoid volume susceptibilities $\chi s$. Specifically, FIG. 13 indicates a distribution of the dispersoid volume susceptibilities $\chi s$ each plotted for corresponding one of particle diameters. In FIG. 13, the horizontal axis represents the particle diameter and the vertical axis represents the dispersoid volume susceptibility $\chi s$. FIG. 13 further indicates a regression line and an equation (approximate function) thereof. The approximate function (equation expressing the regression line) can be obtained by the least squares method, for example. The operation section 40 described with reference to FIG. 1 generates image data of the graph and the regression line indicated in FIG. 13 through obtaining information on the dispersoid volume susceptibilities $\chi s$ and information on the particle diameters of the respective dispersoid particles s in the disperse system D (dispersion medium m). The image based on the image data generated by the operation section 40 is output through an output device such as a display or a printer.

Specifically, the sixteenth distribution of the dispersoid volume susceptibilities $\chi s$ indicates a relationship between the dispersoid volume susceptibilities $\chi s$ and particle diameters of ODS particles (dispersoid particles s) obtained through dispersion of the ODS particles in acetone (a dispersion medium m). As indicated in FIGS. 11 and 13, the distribution of the volume susceptibilities $\chi s$ of the ODS particles that are hydrophobized porous silica gel particles is narrower than that of the porous silica gel particles even in a situation in which the dispersion medium m is the same, acetone. This indicates that hydrophobization of the surfaces of the porous silica gel particles increases the affinity of the porous silica gel particles for acetone.

Figure 14:
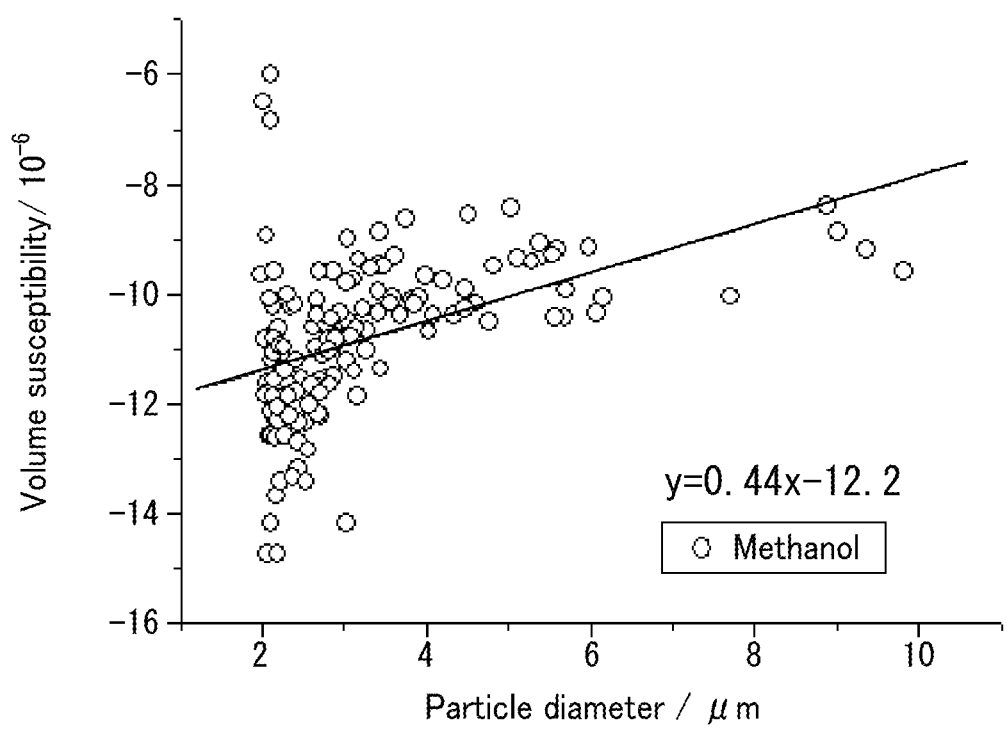
FIG. 14 is a graph representation indicating a seventeenth distribution of dispersoid volume susceptibilities according to the embodiment of the present invention.
Figure 15:
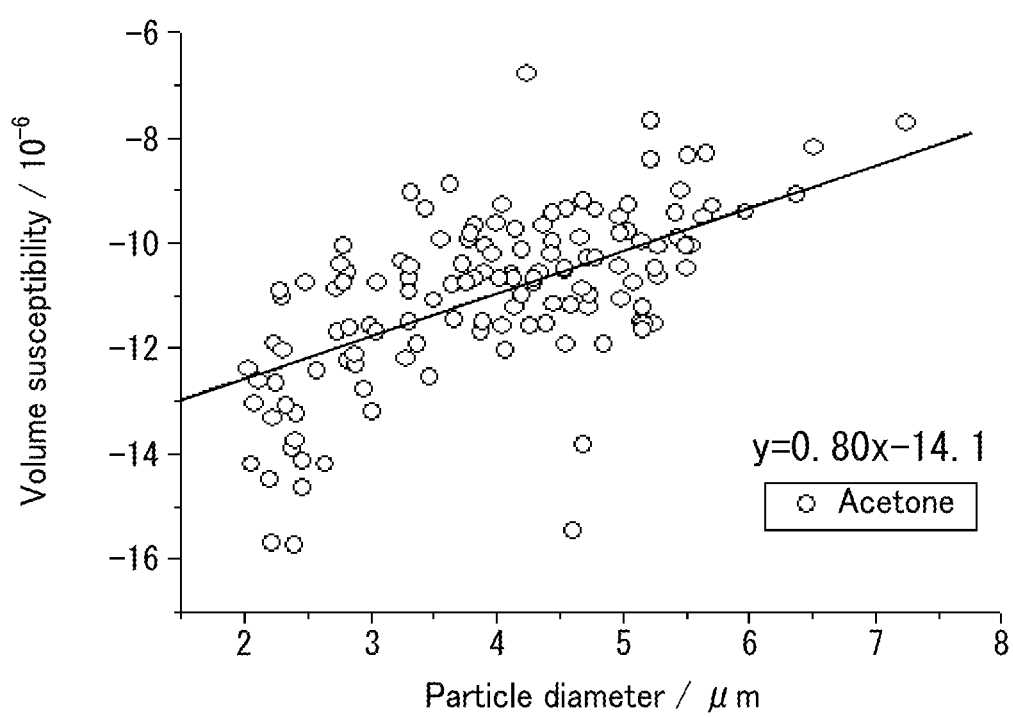
FIG. 15 is a graph representation indicating an eighteenth distribution of dispersoid volume susceptibilities according to the embodiment of the present invention.

FIGS. 14 and 15 are graph representations (scatter diagrams) of seventeenth and eighteenth distributions of dispersoid volume susceptibilities $\chi s$, respectively. Specifically, FIGS. 14 and 15 indicate two distributions of dispersoid volume susceptibilities $\chi s$ each plotted for corresponding one of particle diameters. In FIGS. 14 and 15, the horizontal axis represents the particle diameter and the vertical axis represents the dispersoid volume susceptibility $\chi s$. Furthermore, FIGS. 14 and 15 each indicate a regression line and an equation (approximate function) thereof. The approximate function (equation expressing the regression line) can be obtained by the least squares method, for example. The operation section 40 described with reference to FIG. 1 generates image data of the graphs and the regression lines indicated in FIGS. 14 and 15 through obtaining information on the volume susceptibilities $\chi s$ of respective dispersoid particles s and information on the particle diameters thereof in the disperse system D (dispersion medium m). The image based on the image data generated by the operation section 40 is output through an output device such as a display or a printer.

Specifically, the seventeenth distribution of the dispersoid volume susceptibilities $\chi s$ indicates a relationship between the dispersoid volume susceptibilities $\chi s$ and particle diameters of polyethylene particles (dispersoid particles s) obtained through dispersion of the polyethylene particles in methanol (a dispersion medium m). By contrast, the eighteenth distribution of the dispersoid volume susceptibilities $\chi s$ indicates a relationship between the dispersoid volume susceptibilities $\chi s$ and particle diameters of polyethylene particles (dispersoid particles s) obtained through dispersion of the polyethylene particles in acetone (a dispersion medium m).

As indicated in FIGS. 14 and 15, the larger the particle diameter of the polyethylene particle, which is porous, is, the closer the dispersoid volume susceptibility $\chi s$ is to the dispersion medium volume susceptibility $\chi m$. By contrast, the width of the distribution of the particle diameters differed due to difference in dispersion medium m. Specifically, the distribution of the particle diameters is wider when the polyethylene particles are dispersed in acetone than when the polyethylene particles are dispersed in methanol. The reason thereof is that the polyethylene particles are swelled in the acetone. As such, the measurement results indicated in FIGS. 14 and 15 indicate that acetone tends to enter inside the polyethylene particle when compared with methanol. That is, the measurement results indicate that the affinity of the polyethylene particles for acetone is stronger than that for methanol.

Note that the operation section 40 may analyze the affinity of the dispersoid particles s for the dispersion medium m through analysis of the distribution of the volume susceptibilities $\chi s$ versus the particle diameters of the respective dispersoid particles s. For example, the operation section 40 may analyze the distribution of the volume susceptibilities $\chi s$ versus the particle diameters of the respective dispersoid particles s using the approximate function (equation expressing the regression line) and obtain a value (parameter) indicating the affinity of the dispersoid particles s for the dispersion medium m by calculation (numeric analysis). More specifically, for example, the operation section 40 may perform numeric analysis of the width of the distribution of the dispersoid volume susceptibilities $\chi s$ around the regression line and obtain a value (parameter) indicating the affinity of the dispersoid particles s for the dispersion medium m. Alternatively, for example, the operation section 40 may perform numeric analysis of the width of the distribution of the particle diameters of the respective dispersoid particles s and obtain a value (parameter) indicating the affinity of the dispersoid particles s for the dispersion medium m.

As described above, the affinity of the dispersoid particles s for the dispersion medium m can be evaluated in a quantitative manner using the volume susceptibility $\chi m$ of the dispersion medium m and the volume susceptibilities $\chi s$ of the dispersoid particles s in the dispersion medium m likewise in the first embodiment. Furthermore, quantitative evaluation of dispersibility of the dispersoid particles s can be enabled likewise in the first embodiment.

INDUSTRIAL APPLICABILITY

The present invention is applicable to analysis of for example a particle, a crystal, and a droplet.

REFERENCE SIGNS LIST 10 analyzing apparatus
20 magnetic field generating section
30 measurement section
40 operation section
50 light source
m dispersion medium
s dispersoid particle
C capillary
D disperse system

The invention claimed is:

1. A method for quantitatively evaluating an amount of a dispersion medium adsorbed to dispersoid particles, the method comprising:
causing magnetophoresis of each of the dispersoid particles in the dispersion medium by generating a magnetic field gradient by a magnetic field generating section; measuring by a measurement section movement of each of the dispersoid particles under magnetophoresis in the dispersion medium;
calculating by an operation section magnetophoresis speeds of the respective dispersoid particles based on a measurement result by the measurement section; calculating by the operation section volume susceptibilities of the respective dispersoid particles dispersed in the dispersion medium based on the magnetophoresis speeds of the respective dispersoid particles; and
generating image data based on the volume susceptibilities of the respective dispersoid particles by the operation section, the image data indicating that the larger an amount of the dispersion medium adsorbed to the dispersoid particles is, the closer to the volume susceptibility of the dispersion medium the volume susceptibilities of the respective dispersoid particles are.

2. The method according to claim 1, further comprising:
calculating by the operation section particle diameters of the respective dispersoid particles dispersed in the dispersion medium based on the measurement result by the measurement section, wherein
the generating image data includes generating a distribution of the volume susceptibilities of the respective dispersoid particles each plotted for a corresponding one of the particle diameters and a regression line indicating a relationship between the particle diameters and the distribution of the volume susceptibilities of the respective dispersoid particles by the operation section based on the volume susceptibilities and the particle diameters of the respective dispersoid particles.

3. The method according to claim 2, further comprising analyzing whether or not a width of the distribution of the volume susceptibilities of the respective dispersoid particles relative to the regression line is narrow in the distribution of the volume susceptibilities of the respective dispersoid particles each plotted for a corresponding one of the particle diameters, wherein
the narrower the width of the distribution of the volume susceptibilities of the respective dispersoid particles relative to the regression line is, the larger the amount of the dispersion medium adsorbed to the dispersoid particles is.

4. The method according to claim 1, wherein the generating image data includes generating a distribution of the volume susceptibilities of the respective dispersoid particles by the operation section.

5. The method according to claim 4, further comprising analyzing whether or not the distribution of the volume susceptibilities of the respective dispersoid particles is close to the volume susceptibility of the dispersion medium, wherein the closer to the volume susceptibility of the dispersion medium the distribution of the volume susceptibilities of the respective dispersoid particles is, the larger the amount of the dispersion medium adsorbed to the dispersoid particles is.

6. The method according to claim 1, wherein the generating image data includes generating a distribution of differences between the volume susceptibilities of the respective dispersoid particles and the volume susceptibility of the dispersion medium based on the volume susceptibilities of the respective dispersoid particles and the volume susceptibility of the dispersion medium by the operation section.

7. The method according to claim 6, further comprising analyzing whether or not the differences between the volume susceptibilities of the respective dispersoid particles and the volume susceptibility of the dispersion medium are small, wherein
the smaller the differences between the volume susceptibilities of the respective dispersoid particles and the volume susceptibility of the dispersion medium are, the larger the amount of the dispersion medium adsorbed to the dispersoid particles is.

8. The method according to claim 1, further comprising calculating by the operation section particle diameters of the respective dispersoid particles in the dispersion medium based on the measurement result by the measurement section, wherein
the generating image data includes generating a distribution of the volume susceptibilities of the respective dispersoid particles each plotted for a corresponding one of the particle diameters by the operation section based on the volume susceptibilities and the particle diameters of the respective dispersoid particles.

9. The method according to claim 8, further comprising analyzing whether or not a width of the distribution of the volume susceptibilities of the respective dispersoid particles is narrow in the distribution of the volume susceptibilities of the respective dispersoid particles each plotted for a corresponding one of the particle diameters, wherein
the narrower the width of the distribution of the volume susceptibilities of the respective dispersoid particles is, the larger the amount of the dispersion medium adsorbed to the dispersoid particles is.

10. The method according to claim 8, further comprising analyzing whether or not a width of a distribution of the particle diameters of the respective dispersoid particles is wide in the distribution of the volume susceptibilities of the respective dispersoid particles each plotted for a corresponding one of the particle diameters, wherein
the wider the distribution of the particle diameters of the dispersoid particles is, the larger the amount of the dispersion medium adsorbed to the dispersoid particles is.

11. An apparatus for quantitatively evaluating an amount of a dispersion medium adsorbed to dispersoid particles, comprising:

a magnetic field generating section configured to cause magnetophoresis of each of the dispersoid particles in the dispersion medium by generating a magnetic field gradient;

a measurement section configured to measure movement of each of the dispersoid particles under magnetophoresis in the dispersion medium; and an operation section configured to calculate volume susceptibilities of the respective dispersoid particles based on a measurement result by the measurement section and configured to generate image data based on the volume susceptibilities of the respective dispersoid particles, the image data indicating that the larger the amount of the dispersion medium adsorbed to the dispersoid particles is, the closer to the volume susceptibility of the dispersion medium the volume susceptibilities of the respective dispersoid particles are.

12. The apparatus according to claim 11, wherein the operation section generates, as the image data, image data indicating a distribution of differences in volume susceptibility between the respective dispersoid particles and the dispersion medium based on the volume susceptibilities of the respective dispersoid particles and the volume susceptibility of the dispersion medium, and the smaller the differences between the volume susceptibilities of the respective dispersoid particles and the volume susceptibility of the dispersion medium are, the larger the amount of the dispersion medium adsorbed to the dispersoid particles is.

13. The apparatus according to claim 11, wherein the operation section calculates particle diameters of the respective dispersoid particles in the dispersion medium based on the measurement result by the measurement section, and generates, as the image data, image data indicating a distribution of the volume susceptibilities of the respective dispersoid particles each plotted for a corresponding one of the particle diameters based on the particle diameters and the volume susceptibilities of the respective dispersoid particles, and in the distribution of the volume susceptibilities of the respective dispersoid particles each plotted for a corresponding one of the particle diameters, the narrower a width of the distribution of the volume susceptibilities of the respective dispersoid particles is, the larger the amount of the dispersion medium adsorbed to the dispersoid particles is.

14. The apparatus according to claim 11, wherein the operation section calculates particle diameters of the respective dispersoid particles in the dispersion medium based on the measurement result by the measurement section, calculates a regression line indicating a relationship between the particle diameters and a distribution of the volume susceptibilities of the respective dispersoid particles, and generates, as the image data, image data including the regression line and the distribution of the volume susceptibilities of the respective dispersoid particles each plotted for a corresponding one of the particle diameters, and, in the distribution of the volume susceptibilities of the respective dispersoid particles each plotted for a corresponding one of the particle diameters, the narrower a width of the distribution of the volume susceptibilities of the respective dispersoid particles relative to the regression line is, the larger the amount of the dispersion medium adsorbed to the dispersoid particles is.

15. The apparatus according to claim 11, wherein the operation section calculates particle diameters of the respective dispersoid particles in the dispersion medium based on the measurement result by the measurement section, and generates, as the image data, image data indicating a distribution of the volume susceptibilities of the respective dispersoid particles each plotted for a corresponding one of the particle diameters based on the respective diameters and the volume susceptibilities of the respective dispersoid particles, and in the distribution of the volume susceptibilities of the respective dispersoid particles each plotted for a corresponding one of the particle diameters, the wider a width of a distribution of the particle diameters of the respective dispersoid particles is, the larger the amount of the dispersion medium adsorbed to the dispersoid particles is.

16. The apparatus according to claim 11, wherein the operation section generates as the image data image data indicating a distribution of the volume susceptibilities of the respective dispersoid particles, wherein the closer to the volume susceptibility of the dispersion medium the distribution of the volume susceptibilities of the dispersoid particles is, the larger the amount of the dispersion medium adsorbed to the dispersoid particles is.

* * * * *